United States Patent [19]
Nishio et al.

[11] Patent Number: 4,973,574
[45] Date of Patent: Nov. 27, 1990

[54] SUPERCONDUCTING WIRE AND METHOD OF MANUFACTURING THE SAME

[75] Inventors: Masanobu Nishio; Kazuhiko Hayashi; Yoshihiro Nakai; Kengo Ohkura; Kazuo Sawada, all of Osaka, Japan

[73] Assignee: Sumitomo Electric Industries, Ltd., Osaka, Japan

[21] Appl. No.: 176,560

[22] Filed: Apr. 1, 1988

[30] Foreign Application Priority Data

Apr. 2, 1987 [JP] Japan .................................. 62-81820
Apr. 7, 1987 [JP] Japan .................................. 62-86563
Apr. 13, 1987 [JP] Japan .................................. 62-90147

[51] Int. Cl.$^5$ ..................... H01B 12/00; H01L 39/24; B29C 47/00; B29C 47/88
[52] U.S. Cl. .......................................... 505/1; 29/599; 264/85; 264/211.11; 505/704; 505/733; 505/740
[58] Field of Search ................. 264/85, 211.11; 505/1, 505/813, 809, 810, 822, 739, 740, 733, 704; 29/599

[56] References Cited

U.S. PATENT DOCUMENTS

| | | | |
|---|---|---|---|
| 3,868,241 | 2/1975 | Felice et al. | 65/134 |
| 4,103,063 | 7/1978 | Hulse | 416/241 B |
| 4,104,355 | 8/1978 | Dunn et al. | 264/210.6 |
| 4,339,508 | 7/1982 | Tsuya et al. | 428/606 |
| 4,650,618 | 3/1987 | Heinemann et al. | 264/85 X |
| 4,762,754 | 8/1988 | Nellis et al. | 428/552 |

OTHER PUBLICATIONS

Johnson et al., "Fabrication of Ceramic Articles from High $T_c$ Superconducting Oxides", High Temperature Superconductors, ed. Gubser, 1987, pp. 193-195.
Matsuzaki et al., "High $T_c$ Superconductivity of a Melt Spun ErBa$_2$Cu$_3$ Oxide Ribbon", Jap. Journal of App. Phys., vol. 26, No. 8, Aug. 1987, pp. L1384-L1387.
Jin et al., "Fabrication of Dense Ba$_2$Y Cu$_3$O$_{7-\delta}$ Superconductor Wire by Molten Oxide Processing", 1987.
Goto et al., "Preparation of High $T_c$ Y-Ba-Cu-O Superconducting Filaments by Suspension Spinning Method", Jap. J. App. Phys., vol. 26, No. 9, Sep. 1987, pp. L1527-L1528.
M. K. Wu, et al., "Superconductivity at 93K in a New Phase Y-Ba-Cu-O, Compound System at Ambient Pressure", Physical Review Letters, 58(9), 908, Mar. 1987.
E. C. Berhman, et al., "Synthesis, Characterization and Fabrication of High Temperature Superconducting Oxides", Adv. Ceram. Meter., 2(3B) p. 539, Jul. 1987.

Primary Examiner—Mary Lynn Fertig
Attorney, Agent, or Firm—Pennie & Edmonds

[57] ABSTRACT

A method of manufacturing a superconducting wire is carried out by first preparing a material being composed of $Y_1Ba_2Cu_3O_7$. This material is melted in a platinum crucible. A melt thus obtained is drawn out from a hole provided on the bottom wall of the crucible to be linearly discharged. The linearly discharged melt is cooled and solidified. A cooling/solidifying space for such a step is set at a temperature less by about 10° C. than the solidifying point of the material, and a slow-cooling zone is provided next to the cooling/solidifying space. This slow-cooling zone is provided to be at a relatively high temperature in a portion closer to the hole while having a temperature gradient along a direction for linearly discharging the melt. A superconducting wire being composed of $Y_1Ba_2Cu_3O_7$ is obtained. This superconducting wire superconducts at 85K.

21 Claims, 2 Drawing Sheets

SUPERCONDUCTING WIRE AND METHOD OF MANUFACTURING THE SAME

BACKGROUND OF THE INVENTION

The present invention relates to a method of manufacturing a superconducting wire, and more particularly, it relates to a method of manufacturing a superconducting wire of a ceramic superconductive material.

DESCRIPTION OF THE PRIOR ART

Metal and ceramic superconductors have generally been well known in the art, and extensive studies have been performed concerning application of such superconductors to various uses. A superconductor loses all resistance to electric current when held at a temperature below its critical temperature. Through this property, attempts have been made for generation of high magnetic fields and lossless transmission of large currents.

In order to use a superconductor for generation of a high magnetic field or high density power transmission, it is necessary to provide the same in the form of a thin wire. Most other superconductor applications also require superconductive wires. However, although known metal superconductive materials can be easily worked into wire rods, the critical temperatures thereof, e.g., being lower than about 23 K, largely restrict employable cooling mediums, whereby their application is extremely limited.

On the other hand, some ceramic superconductive materials have high critical temperatures. However, it is extremely difficult to work such ceramic superconductive materials into wire rods. Even if the materials are worked into wire rods, it is extremely difficult to provide stable electrical properties over the entire length thereof.

In general, a wire of a ceramic superconductor is manufactured by:

(1) performing cold working at the normal temperature; or
(2) heating the material to a temperature for facilitating plastic working.

In the case of the method (1), however, wire drawing of the raw material of a ceramic superconductor tends to be non-uniform, causing disconnection of the superconductive portions of the wire, hence the degree of fineness of the wire is restricted. Further, even if the superconductor is worked into a wire rod of considerable thickness, its electrical properties are degraded to some extent.

In the case of the method (2) a raw material for the ceramic superconductor is generally placed in a metal tube, heated to a high temperature and thereafter extruded into the form of a rod, to be further subjected to wire drawing by a die or the like, if necessary. Thus, the raw material for the ceramic superconductor is subjected to heat treatment while it is isolated from the external atmosphere by the metal tube, which prevents exposure to elements required to form the superconductor, such as oxygen. Thus, the superconductor cannot be provided with expected critical temperature and critical current. Further, the degree of fineness of the wire rod is restricted.

Ceramic superconductive materials can be shaped into elongated linear bodies, for example, to be applied to uses such as power transmission/distribution, electric connection of various devices or elements, winding for a coil, and the like.

It is known that ceramic superconductive materials, those of Y-Ba-Cu-O, for example, of perovskite or pseudoperovskite structure, superconduct at high critical temperatures.

SUMMARY OF THE INVENTION

An object of the present invention is to provide a method of efficiently manufacturing a superconducting wire of a ceramic superconductive material of high critical temperature which can be worked into a wire with no degradation in electrical property, and a superconducting fine wire obtained by the said method.

The present invention provides a method of manufacturing a superconductor made of a ceramic superconductive material, preferably a compound material containing oxygen and at least two sorts of metal elements, and of layer structure.

Provided according to the present invention is a method of manufacturing a ceramic superconductor of composition $A_a B_b C_c$. In this general formula, A represents at least a single element, preferably at least two elements selected from groups Ia, IIa and IIIa of the periodic table. The elements belonging to group Ia of the periodic table are H, Li, Na, K, Rb, Cs and Fr. The elements belonging to group IIa of the periodic table are Be, Mg, Ca, Sr, Ba and Ra. The elements belonging to group IIIa of the periodic table are Sc, Y, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No and Lr.

On the other hand, B in the general formula represents at least a single element selected from groups Ib, IIb and IIIb of the periodic table. The elements belonging to group Ib of the periodic table are Cu, Ag and Au and those belonging to group IIb are Zn, Cd and Hg, while those belonging to group IIIb are B, Al, Ga, In and Tl.

C represents at least a single element selected from oxygen, carbon, nitrogen, fluorine and sulfur.

The variables a, b and c represent numbers showing the molor ratio of A, B and C respectively. Relation a $\times$(average valence of A) +b $\times$(average valence of B) =c $\times$(average valence of C) generally holds for a, b and c, while satisfaction of such relation is not necessarily required.

In the above final composition, B preferably contains at least copper and C preferably contains at least oxygen, for the possibility of attaining a higher critical temperature.

According to the inventive method of manufacturing a superconducting wire, there is first prepared a raw material composed of a compound containing oxygen and at least two sorts of metal elements and being in layer structure, or a raw material being in composition generally expressed in the formula $A_a B_b C_c$. The raw material is melted in a vessel having a hole communicating with its interior. The melt obtained by such melting is linearly discharged from the hole by either extrusion or drawout. The linearly discharged melt is cooled and solidified. This melt may be solidified by forced cooling or natural standing. Further, a vitrifying compound such as $B_2O_3$, $GeO_2$ or $P_2O_5$ may be added in the step of melting the raw material, in order to bring the melt into a highly viscous glassy state. In this case, the solidified body obtained may be crystallized by further re-heating.

According to the aforementioned method of manufacturing a superconducting wire rod, the ceramic superconductive material can be brought into a considerably viscous state by melting in a heating vessel. Thus, a superconducting wire rod can be obtained by extruding or drawing out the melt from the hole. Since the melt is extruded or drawn out while in a considerably viscous state, the wire rod can be very thin, equal in diameter to the size of the hole.

Thus, according to the present invention, a superconducting wire is manufactured by melting ceramic superconductive material and extruding or drawing out the same, whereby a superconducting wire having a high critical temperature and excellent electrical properties can be obtained by a simple method.

In the aforementioned melting-cooling/solidifying method according to the present invention, it is difficult to obtain a ceramic superconducting wire of stoichiometric composition and uniform properties even if the raw material is correctly prepared. The composition of the ceramic superconducting wire is subject to fluctuation due to dissociation and recoupling of the elements of the raw material while in the molten state. The inventors have found that a ceramic superconducting wire can be reliably manufactured by adjusting the atmosphere in which at least in one of the steps is performed, in particular the melting and cooling/solidifying steps.

According to the inventive method of manufacturing a superconducting wire, a raw material of composition $A_a B_b C^x c^x$ is first prepared. In the general formula $A_a B_b C^x c^x$, $C^x$ represents at least a single element selected from oxygen, carbon, nitrogen and sulfur, which may be identical to the aforementioned element C or a part of C if C consists of two or more elements. The $c^x$ represents a number showing the composition ratio of $C^x$.

According to this manufacturing method, the material expressed as $A_a B_b C^x c^x$ is first melted. The method further comprises the step of linearly discharging a melt of $A_a B_b C^x c^x$ through extrusion or drawout, and the step of cooling and solidifying the linearly discharged melt of $A_a B_b C^x c^x$.

This manufacturing method thus comprises at least melting, discharging and the cooling/solidifying steps, and some additional steps may be freely performed after the melt is solidified.

Further, the inventive manufacturing method is characterized in that at least one of the entire steps including the aforementioned melting, discharging and cooling/solidifying steps is performed under an atmosphere containing a $C^y$ component of partial pressure being higher than the partial pressure of $C^y$ in the atmospheric air. The $C^y$ component is a gas containing at least a single element selected from oxygen, nitrogen, carbon, fluorine and sulfur. $C^y$ may be identical to C in the aforementioned final composition expressed in the general formula $A_a B_b C_c$, while $C^y$ at least contains the difference between C and $C^x$, i.e., an element left by eliminating $C^x$ from C if C consists of two or more elements. Examples of the $C^y$ gas are oxygen, nitrogen, carbon monoxide, carbon dioxide, hydrogen fluoride and hydrogen sulfide.

The aforementioned atmosphere in which $C^y$ partial pressure is higher than that in the atmospheric air may be employed during one or more of the processing steps. Thus, only the melting step may be performed under this atmosphere, or the cooling/solidifying step may alternatively be performed under this atmosphere, so that melting or cooling/solidification is carried out in an atmosphere being rich in $C^y$. Therefore, if $C^x$ differs from a desired C in the final composition, $C^y$ can be added to the material while molten state or while cooling in the $C^y$ atmosphere, thereby to reliably attain Cc in the final composition.

If $C^x$ in the molten or cooling material is identical to C in the desired final composition, on the other hand, $C^y$ is prepared to be identical in element to $C^x$ and C, to suppress dissociation of the C component in the material while in a molten state, or to recombine the same upon dissociation.

The material may be re-heated after the cooling/solidifying step in an atmosphere in which the $C^y$ partial pressure is higher than that in the atmospheric air. In this case, C in the final composition can be attained by supplying the $C^y$ component in the re-heating step.

It is pointed out that the material expressed in the aforementioned general formula $A_a B_b C^x c^x$ can comprise a partially fabricated item which is not completely superconducting wire can be reliably manufactured.

Thus, according to the present invention, an element which is easily dissociated or changed in a molten state can be presented from such dissociation or change by adjusting the atmosphere under which some of the manufacturing steps are performed, while an element not contained in the raw material can be supplied from the aforementioned atmosphere as the case may be. Thus, a ceramic superconducting wire can be reliably manufactured.

It will be appreciated that the inventive manufacturing method is applicable to a method of manufacturing a ceramic superconducting wire which is employed for general applications of such superconducting wires, in addition to applications in the field of energy, such as a high current density magnet or a long-distance transmission line, or in an electronic device such as a Josephson device.

The present invention is further directed to a method of manufacturing a superconducting wire comprising the steps of melting a ceramic superconductive material in a vessel and extruding or drawing out the molten superconductive material from a hole communicating with the interior of the vessel to cool and solidify the same. This method is characterized in that the cooling/solidifying step is performed at a temperature between the solidifying point of the superconductive material and a temperature no more than 100° C. lower than the solidifying point.

According to the present invention, a molten ceramic superconductive material in a vessel is discharged from a hole communicating with the interior of the vessel to be cooled/solidified. The cooling/solidifying step is performed in an atmosphere at a temperature close to the solidifying point of the superconductive material, i.e., at a temperature no more than 100° C. less than the solidifying point, thereby to reduce thermal distortion caused during solidification of the molten superconductive material. Therefore, an elongated superconducting wire can be manufactured at high productivity with no breaking up of the molten ceramic superconductive material upon solidification. If the temperature of the atmosphere in which the cooling/solidifying step is performed is more than 100° C. less than the solidifying point, as described above, the cooled/solidified ceramic material does not take the desired perovskite or pseudo-perovskite structure, or the fraction of such crystal structure in the whole is reduced. The temperature at which the cooling/solidifying step is carried out is preferably within 50° C. of the solidifying point in order to further reduce thermal distortion caused in solidification.

Preferably the region in which the cooling/solidifying step is performed is maintained is at a relatively high temperature, and is arranged to provide a temperature gradient along the direction of linear discharge of the melt, so that the cooled/solidified superconducting wire is slowly cooled. The desired perovskite or pseudoperovskite structure can be excellently attained in a superconducting wire thus obtained. This has been confirmed by measurement of its critical temperature. Particularly, the average cooling rate is preferably not more than 10° C./min., at least until the temperature reaches 200° C.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
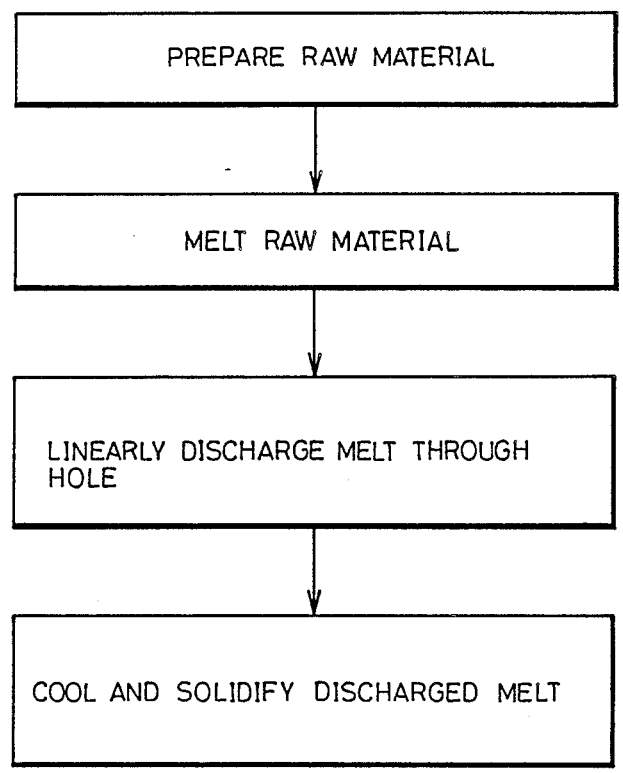
FIG. 1 is a schematic process diagram showing a method of manufacturing a superconducting wire according to the present invention, as a sequence of steps.

FIG. 1 is a process diagram schematically showing a method of manufacturing a superconducting wire according to the present invention. Referring to FIG. 1, a raw material of prescribed composition is first prepared in the form of powder, a compact or the like. This raw material is melted in a vessel having a hole communicating with its interior. A melt thus obtained is linearly discharged from the hole through extrusion or drawout. The linearly discharged melt is thereafter cooled and solidified. Thus, a superconducting wire of prescribed composition is obtained in the form of a solidified body.

The inventive method of manufacturing a superconducting wire is now described with reference to the following Examples.

EXAMPLE 1

Figure 2:
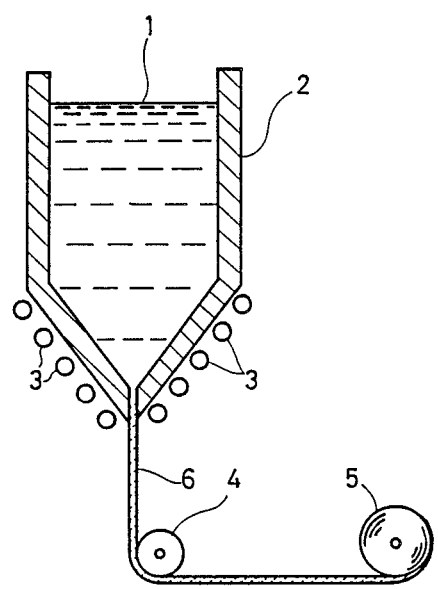
FIG. 2 is a schematic block diagram showing an embodiment of an apparatus for manufacturing a superconducting wire rod based on the inventive manufacturing method.

FIG. 2 is a schematic block diagram showing n embodiment of a superconducting wire rod manufacturing apparatus for carrying out the present invention. A heating source 3 is provided in proximity to an extrusion port of a heating furnace 2 containing powder of a ceramic superconductive material 1. Further provided are a guide roll 4 for guiding a ceramic superconducting wire extruded through the extrusion port and a take-up roll 5 for winding the ceramic superconducting wire.

In more concrete terms, powders of $Y_2O_3$, $BaCO_3$ and $CuO$ mixed in the ratio 0.2:0.6:1 were preliminary sintered at 900° C. for 10 hours and pulverized to prepare the ceramic superconductive material 1, which could be brought into a half-molten state by raising up the inner temperature of the heating furnace 2 to 1000° C. by the heating source 3.

The ceramic superconductive material 1 was extruded from the extrusion port to be wound on the take-up roll 5 through the guide roll 4, thereby to obtain a fine wire 6 of 100 um in diameter.

Sharp superconductivity transition was observed in the superconducting fine wire 6 thus obtained, with a critical temperature of 90 K and critical current of 20 A.

Thus, a superconducting magnet having a high critical temperature and excellent electrical properties can be made using the superconducting fine wire obtained in the aforementioned manner. Alternatively, a superconducting power transmission cable having a high critical temperature and excellent electrical properties can be made using their superconducting fine wire.

In order to form such a superconducting magnet or superconducting power transmission cable, a stabilizing material such as copper is preferably adapted to hold or be held by a large number of fine wires, to prevent heat generation upon quenching of the superconductor into normal conduction, and to carry the current in these circumstances to prevent burning of the superconducting fine wires.

The present invention is not restricted to the aforementioned Example. For example, a ceramic superconducting material can be melted in a coarsely crushed state, and the diameter of the wire rod can be set in a desired value other than 100 um. Further, various modifications may be introduced in design within a scope of the present invention.

EXAMPLE 2

A mixture of $Y_2O_3$, $BaCO_3$ and $CuO$ previously molded and subjected to heat treatment, was melted in a crucible under an atmosphere containing oxygen at 200 Torr. Then the melt was drawn out from a nozzle 500 um in diameter, to be solidified in the form of a fine wire. The fine wire thus obtained was made of ceramics superconductive material composed of $Y_{0.4}Ba_{0.6}CuO_{2.2}$, which superconducted at 90 K.

EXAMPLE 3

A material being in average composition of $La_{1.6}Sr_{0.34}CuO_4$ containing 0.01 wt.% of fluorine was melted in a crucible under an atmosphere containing $SF_6$ gas at 100 Torr. A tape-like member, 30 um in thickness and 60 mm in width, was formed by the so-called roll quenching method, similarly in an atmosphere containing $SF_6$ gas at 100 Torr. This tape-like member was superconductive at 40 K.

EXAMPLE 4

The material obtained in Example 2 was heated under an atmosphere containing oxygen of 200 Torr. at 1100° C. for two hours, to obtain a ceramics superconductive material of $Y_{0.4}Ba0.6CuO_{2.5}$. This ceramics superconductive material superconducted at a temperature of 95 K.

EXAMPLE 5

Figure 3:
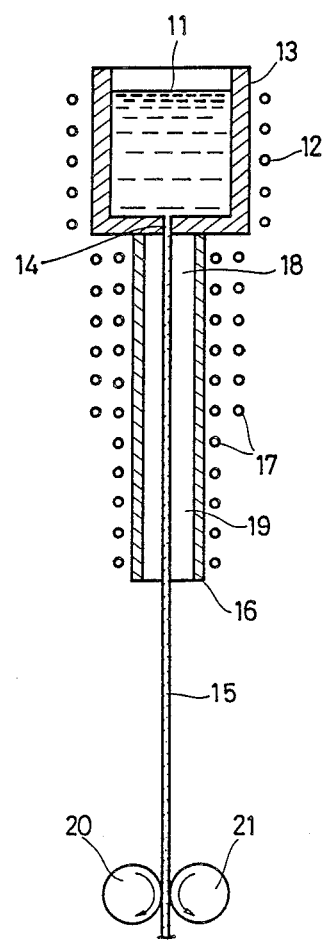
FIG. 3 is a schematic block diagram showing another embodiment of the inventive manufacturing method.

FIG. 3 illustrates Example 5.

A ceramic superconductive material 11 of $YBa_2Cu_3O_7$ having a solidifying point of about 1090° C. was melted at a temperature of 1180° C. in a platinum crucible 13 heated by a heater 12. The molten ceramic superconductive material 11 was drawn out from a hole 14 provided on the bottom wall of the crucible 13 to be cooled/solidified, thereby to obtain a superconducting wire 15.

The space for performing the aforementioned cooling/solidifying step was enclosed by a tunnel 16, for example, and provided with a prescribed temperature by a heater 17 arranged in relation to the tunnel 16. Namely, the tunnel 16 was provided in its relatively upward portion with a cooling/solidifying space 18, while a slow-cooling zone 19 was formed in communication with the cooling/solidifying space 18. The cooling/solidifying space 18 was set at a temperature of 1080° C., while the lower end of the slow-cooling zone 19 was set at a temperature of 1050° C.

The superconducting wire 15 discharged from the tunnel 16 was drawn out through a pair of rollers 20 and 21 rotated along arrows in FIG. 3.

The superconducting wire 15 thus obtained was 50 um in diameter, and superconducted at a critical temperature of 85 K.

A reference example was prepared of the same superconducting materials, but the drawing took place without heating by the heater 17. However, this superconducting wire 15 was occasionally broken.

The superconducting wire obtained by the inventive method is not restricted to a circular section. The sectional configuration of the superconducting wire depends on that of the hole 14 provided in communication with the interior of the crucible 13, so that a superconducting wire of arbitrary sectional configuration, such as a tape, can be obtained by changing the configuration of the hole 14.

EXAMPLE 6

Respective powder materials of $Bi_2O_3$, $SrCO_3$, $CaCO_3$ and CuO were weighed so that Bi, Sr, Ca and Cu were in the composition ratio 1:1:1:2, mixed with each other, and fired in the atmospheric air at 800° C. for eight hours, thereby to prepare a raw material powder.

This powder was introduced into a crucible and melted, and was drawn out and solidified in the atmospheric air through the apparatus as shown in FIG. 3, thereby to obtain a fine wire of 100 um in diameter. This fine wire was annealed in the atmospheric air at 830° C. for eight hours, and thereafter slowly cooled. The critical temperature $T_c$ of the fine wire thus obtained was measured through measurement of electric resistance by the usual four-terminal method. This fine wire was of such superconductivity that its electric resistance reached zero at 100 K.

EXAMPLE 7

A material obtained by adding $B_2O_3$ of 20% in mole ratio to ceramics superconductive material composed of $Y_1Ba_2Cu_3O_{7-x}$ was introduced into a crucible, melted, drawn out and solidified in the atmospheric air at 800° C. through the apparatus as shown in FIG. 3, thereby to obtain a fine wire of 50 um in diameter. This fine wire was in a partially crystallized glassy state. Then the fine wire was annealed in the atmospheric air at 700° C. for six hours, and thereafter slowly cooled. The critical temperature $T_c$ of this fine wire was 85 K.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a super conductive wire composed of a ceramic superconductive material of composition AaBbCucOd, wherein:
   A is at least one of Y, La, and Bi;
   B is at least one of Ca, Sr, and Ba; and
   a,b,c, and d represent the relative molar ratios of A, B, Cu and O
comprising the steps of:
   preparing a raw material precursor of said ceramic superconductive material;
   melting said raw material in a vessel having a hole in communication with its interior to obtain a melt;
   linearly discharging said melt from said hole by either extrusion or drawout; and
   cooling and solidifying said linearly discharged melt to obtain a solidified body.

2. A method of manufacturing a superconducting conducting wire in accordance with claim 1, wherein said step of melting said raw material to obtain a melt includes a further step of adding at least a single vitrifying compound selected from $B_2O_3$, $GeO_2$ and $P_2O_5$ to said material in said vessel, to obtain a viscous glassy melt.

3. A method of manufacturing a superconducting wire in accordance with claim 2, comprising a further step of re-heating said solidified body to crystallize the same.

4. The method of claim 1, wherein said solidified body is cooled and solidified in free space.

5. The method of claim 4, wherein the rate of cooling and solidification of such body is controlled by controlling the temperature of an atmosphere in such free space.

6. The method of claim 5, wherein the composition of the atmosphere in such free space is controlled in accordance with the desired final composition of the ceramic superconductive material.

7. A method of manufacturing a superconducting wire comprising a ceramic superconductive material of composition AaBbCucOd, wherein:
   A is at least one of Y, La, and Bi;
   B is at least one of Ca, Sr, and Ba; and
   a, b, c, and d represent the relative molar ratios of A, B, Cu and O,
said method comprising:
   preparing a raw material being in composition generally expressed in a formula $AaBbCucC^xc^x$, where $C^x$ represents at least a single element selected from oxygen, carbon, nitrogen, fluorine and sulfur and $c^x$ represents a number showing the composition ratio of $C^x$;
   melting said raw material in a vessel having a hole in communication with its interior to obtain a melt;
   linearly discharging said melt from said hole by either extrusion or drawout; and
   cooling and solidifying said linearly discharged melt to obtain a solidified body;
   wherein at least one of said melting, discharging said melt and cooling and solidifying steps is performed in an atmosphere containing a $C^Y$ component of partial pressure higher than the partial pressure of $C^Y$ in the atmospheric air, $C_Y$ being a gas containing at least a single element selected from oxygen, nitrogen, carbon, fluorine and sulfur.

8. A method of manufacturing a superconducting wire in accordance with claim 7, wherein said $C^x$ and said $C^Y$ are identical to O.

9. A method of manufacturing a superconducting wire in accordance with claim 7, wherein
said melting step comprises a step of adding sad $C^Y$ to said melt in an atmosphere containing said $C^Y$ at a partial pressure higher than the partial pressure of $C^Y$ in the atmospheric air.

10. A method of manufacturing a superconducting wire in accordance with claim 7, wherein
said cooling and solidifying step comprises a step of cooling and solidifying said melt in an atmosphere containing said $C^Y$ at a partial pressure higher than the partial pressure of $C^Y$ in the atmosphere air.

11. A method of manufacturing a superconducting wire in accordance with claim 7, comprising a further step of re-heating said solidified body in an atmosphere containing said $C^Y$ component at a partial pressure higher than the partial pressure of $C^Y$ in the atmospheric air, after said cooling and solidifying step.

12. A method of manufacturing a superconducting wire comprising a ceramic superconductive material of composition $A_aB_bCu_cO_d$, wherein:
A is at least one of Y, La, and Bi;
B is at least one of Ca, Sr, and Ba; and
a,b,c and d represent the relative molar ratios of A,B,Cu and O,
said method comprising the steps of:
preparing a raw material of composition $A_aB_bCu_cO_d$
melting said raw material in a vessel having a hole in communication with its interior to obtain a melt;
linearly discharging said melt from said hole by either extrusion or drawout; and
cooling and solidifying said linearly discharged melt to obtain a solidified body,
said cooling and solidifying step being performed at a temperature less than the solidifying point of said raw material but not more than 100° C. less than said solidifying point.

13. A method of manufacturing a superconducting wire in accordance with claim 12, wherein
said cooling and solidifying is performed at a temperature less than said solidifying point but not more than 50° C. less than said solidifying point.

14. A method of manufacturing a superconducting wire in accordance with claim 12, wherein
a zone between said hole and a defined space in which said cooling and solidifying step is performed is provided at a temperature above the temperature of said space, and having a temperature gradient along the direction of discharge of the melt,
said method further comprising the step of passing said solidified body through said zone to slowly cool the same.

15. A method of manufacturing a superconducting wire in accordance with claim 12, wherein the cooling and solidifying step is performed in free space.

16. The method of claim 1, 7, or 12, wherein A contains at least two of Y, La and Bi.

17. The method of claim 16, wherein said ceramic superconductive material is of layered structure.

18. The method of claim 1, 7 or 12, wherein the step of cooling and solidifying is performed at a temperature lower than but no more than 100° C. less than the solidification temperature of the melt.

19. The method of claim 1, 7 or 12, wherein said step of cooling and solidifying is performed at a temperature lower than but not more than 50° C. less than the solidification temperature of the melt.

20. The method of claim 1, 7 or 12, wherein said step of cooling and solidifying is performed by passing the melt withdrawn from the vessel through a zone having a temperature gradient, to slowly cool it.

21. A superconducting wire made by the process of claim 1, 7 or 12.

* * * * *